United States Patent [19]

Sasao et al.

[11] Patent Number: 5,654,878
[45] Date of Patent: Aug. 5, 1997

[54] SOLDER TAIL AND ELECTRIC CONNECTOR INCORPORATING SAME

[75] Inventors: Masami Sasao; Hideyuki Hirata, both of Yokohama, Japan

[73] Assignee: Molex Incorporated, Lisle, Ill.

[21] Appl. No.: 489,642

[22] Filed: Jun. 12, 1995

[30] Foreign Application Priority Data

Jul. 19, 1994 [JP] Japan ................ 6-009894 U

[51] Int. Cl.$^6$ .................................................. H01L 23/48
[52] U.S. Cl. ............................................ 361/773; 257/692
[58] Field of Search .............................. 257/692, 697; 361/772, 773; 29/827; 439/78, 83, 884

[56] References Cited

U.S. PATENT DOCUMENTS

| | | | |
|---|---|---|---|
| 3,778,887 | 12/1973 | Suzuki et al. | 29/827 |
| 5,398,165 | 3/1995 | Niinou | 361/774 |

FOREIGN PATENT DOCUMENTS

| | | | |
|---|---|---|---|
| 60-164345 | 8/1985 | Japan | 29/827 |
| 62-163352 | 7/1987 | Japan | 257/692 |

*Primary Examiner*—Neil Abrams
*Attorney, Agent, or Firm*—Charles S. Cohen

[57] ABSTRACT

An improved connector terminal has a profile which facilitates insertion into engagement holes on a circuit board and increases resistance to deformation. The terminals may be part of an assembly which includes a series of terminals arranged in a spaced-apart array. Each has a solder tail portion defined by a straight edge (11) proximate to the centerline (9) and a slanted edge (12) which diagonally extends from the other side and which traverses the centerline (9) to intersect with the straight edge (11) to thereby form an acute angle at the tip (E) of the terminal near the centerline (9) to provide comparable positioning allowances on the opposite sides of the centerline (9) to facilitate mounting of the terminals on a circuit board. The acute angle point is advantageous to the optical measurement of terminal intervals for the quality control.

20 Claims, 5 Drawing Sheets

SOLDER TAIL AND ELECTRIC CONNECTOR INCORPORATING SAME

BACKGROUND OF THE INVENTION

The present invention relates generally to a terminal assembly for an electric connector, and more particularly to a terminal having an improved solder tail portion which facilitates the attaching of the terminals of a connector to a printed circuit board, and which improves the quality control of mounting connectors to circuit boards.

As is well known, electric connectors are used to connect different electronic devices to printed circuit boards in various electrical and electronic apparatus. Such electric connectors usually include a plurality of terminals arranged at predetermined intervals and fixed to a connector housing. Each terminal may have its tail portion extend outwardly from the housing so that it may be soldered to an associated hole in a circuit board.

In the manufacture of such electric connectors, a plurality of these terminals are typically inserted into corresponding holes of the connector housing or are embedded in a connector housing mold and the connector housing formed by injection molding the housing around the terminals. The connector housing often has positioning pegs disposed at its opposite ends, thereby permitting the correct positioning of the connector relative to an associated printed circuit board.

In use, these connectors may be attached to associated circuit boards by positioning the connector on the circuit board with the aid of their connector positioning pegs and by inserting the extending solder tails of the terminals into engagement holes in the circuit board. The terminal solder tails are then soldered to the circuit board. The effectiveness of attachment of the connector to the circuit board depends on the exactness with which all terminals are positioned with respect to the positioning pegs of the housing and the engagement holes. Even if the connector housing is placed onto the circuit board in a correct position with the aid of its positioning pegs, some of the solder tails may not necessarily be aligned with the corresponding engagement holes of the circuit board and, accordingly, may catch against or interfere with the edges of the engagement holes when the connector housing is pushed against the printed circuit board.

This interference may not only lead to bending or other damage to the solder tails, but also may prevent the effective attachment of the electric connector to the circuit board. These disadvantages increase with the reduction of any alignment tolerance for mispositioning each terminal relative to the circuit board engagement hole. Accordingly, difficulty in controlling the quality of these connectors increases with the decrease in tolerance for misalignment for each terminal relative to the corresponding receiving hole in the circuit board.

SUMMARY OF THE INVENTION

The present invention provides a connector housing and a group of terminals arranged at regular intervals in the housing and laterally extending therefrom, the terminals being formed from a terminal assembly, the terminal assembly including a series of spaced-apart terminals integrally connected to a lateral carrier strip and interconnected thereto at a joint portion extending from a terminal body portion to the carrier strip, the joint portion having two generally parallel edges, one edge extending inwardly from the terminal body portion toward the centerline of the joint portion, each terminal of the group of terminals being separated from the lateral carrier strip after being fixed to the housing by cutting the joint portion diagonally to provide a tapered end to the terminal.

A connector of the present invention also comprises a connector housing and a group of terminals laterally arranged at regular intervals and fixed to the housing, each end of the terminal having a solder tail portion, the solder tail portion having a first longitudinal edge which extends close to or in alignment with the centerline of the soldering portion inward from a body portion of the terminal, the solder tail portion having a second edge which intersects the first edge and which extends diagonally across the centerline of the solder tail portion at an acute angle, thereby forming a tapered, or beveled end, to the solder tail portion.

The first edge of the solder tail portion near the tapered end is defined at the time of stamping, and therefore provides a primary reference or alignment line. The acute angle of the tapered end can be used as a reference point in optically aligning the connector terminals with their opposing circuit board engagement holes. The tapered end includes part of a reentrant portion located near the centerline, thereby leaving a relatively large allowance on either side of the terminal solder tail portion such that the terminal may be more easily located in a permissible alignment position relative to the circuit board engagement hole for insertion.

These and other objects, features and advantages of the present invention will be apparent through a reading of the following detailed description, taken in conjunction with accompanying drawings, wherein like reference numerals refer to like parts.

BRIEF DESCRIPTION OF THE DRAWINGS

In the course of the following detailed description, reference will be made to the attached drawings in which.

DETAILED DESCRIPTION OF THE PREFERRED EMBODIMENTS

The benefits and advantages of the structure of the present invention will become more apparent after an examination of the deficiencies and disadvantages of the prior art.

Figure 7:
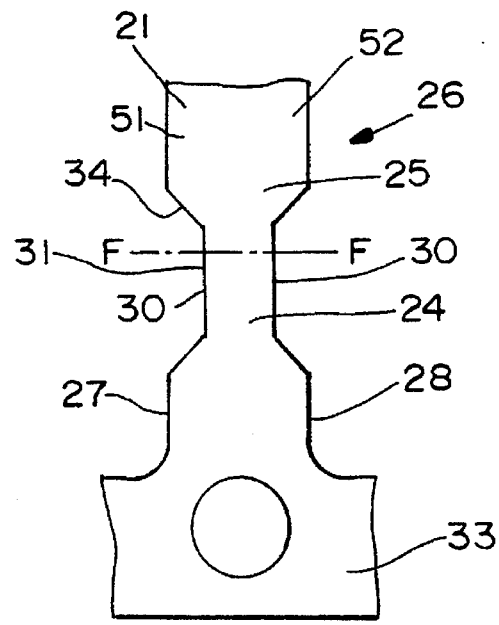
FIG. 7 is a plan view of a portion of a conventional terminal wherein the portion is part of a carrier strip.

FIG. 7 illustrates a tail portion of a conventional connector terminal 21 which is secured in a connector housing (not shown).

The terminals 21 are made in a conventional manner from an elongated metal sheet or strip by stamping to define a continuous arrangement of terminals integrally connected to the carrier strip 33. As seen in FIG. 7, the terminal 21 includes a solder tail 25 which extends out from the connector housing. This solder tail 25 includes the body portion 26 and a reduced width tip which is inserted into the circuit board engagement holes H.

The terminal body portion 26 is relatively wide and has two opposing, generally parallel edges 51, 52 which converge or reduce in width down to that of the joint portion 24. This reduction is defined by the opposing angled edges 34, 25 which extend inwardly from the body portion edges 51, 52 until they attain a predetermined width for the joint portion 24 as represented by opposing parallel edges 30.

The joint portion 24 then diverges outwardly and increases in its width as illustrated at the bottom of FIG. 7 to form another wider section having parallel opposing edges 27, 28 of approximately the same width as the body portion 26. It can be understood that the profile of the joint portion 24 includes, in effect, a notched or reentrant area 31 of the terminals.

The terminal assembly, i.e., the carrier strip 33 and its extending terminals 21 are attached to the connector housing by inserting the terminals 21 (typically contact and body portion first) into corresponding cavities of the connector housing. Then, by cutting all of the terminals 21 from the carrier strip 33 along line F—F, the terminals 21 are separated from the carrier strip so that they attain the reduced end tab profile as indicated at E in FIG. 8. Alternatively, the terminals may be separated from the carrier strip 33 and subsequently inserted into the connector housing.

Figure 8:
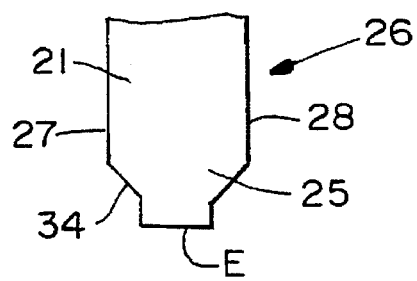
FIG. 8 is a plan view of the tail end of the terminal of FIG. 7 after cutting along line F—F of FIG. 7.
Figure 9:
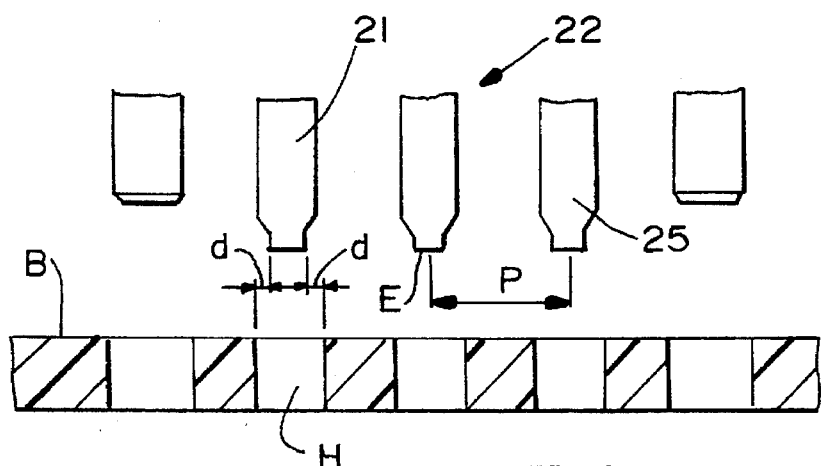
FIG. 9 shows the manner in which a connector using the terminals of FIG. 8 is mounted to a printed circuit board.

In the mounting of the connector onto a circuit board, an optical measurement is often made to determine if the terminals 21 are properly spaced relative to the housing at correct regular intervals as indicated at "P". However, conventional terminals 21 of the type illustrated in FIGS. 7–9 provide no portions or surfaces which may be used as a standard to permit optical measurements. Therefore, the required quality control for ensuring alignment of the terminal solder tail portions with the circuit board engagement holes is difficult. As seen best in FIG. 9, the neck portion 24 only provides a relatively small alignment tolerance "d" on each side of the terminal to be used when inserting the terminals 21 into corresponding holes H of a printed circuit board B. Since tolerance d is small, it increases the difficulty of aligning the terminals 21 with and inserting them into the holes H of the circuit board B.

Figure 10:
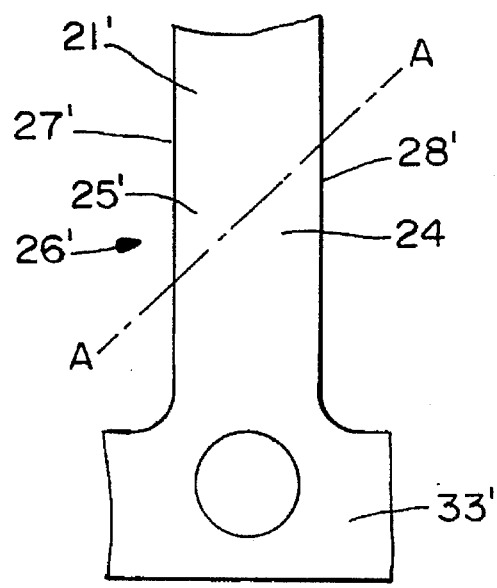
FIG. 10 is a plan view of a portion of another conventional terminal wherein the portion is part of a carrier strip.
Figure 11:
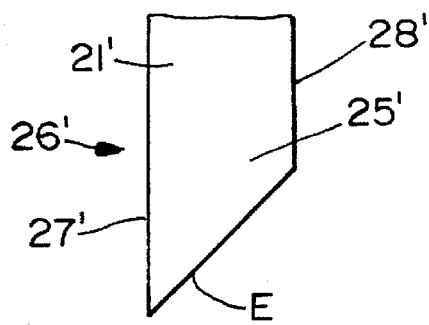
FIG. 11 is a plan view of the tail end of the terminal of FIG. 10 after cutting along line A—A of FIG. 10.
Figure 12:
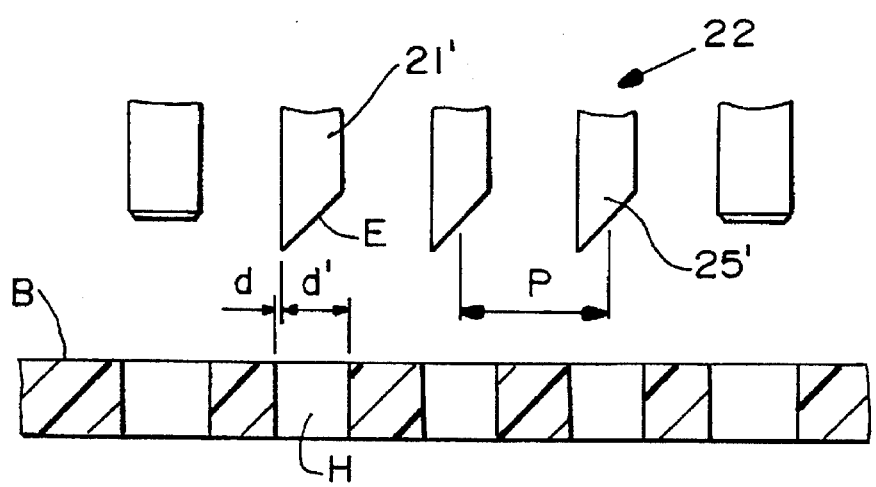
FIG. 12 shows the manner in which a connector using the terminals of FIG. 11 is mounted to a printed circuit board.

FIG. 10 illustrates a second style of conventional connector terminal 21' having a rectangular body portion 25' integrally formed with a carrier strip 33. The body portion 25' has two opposing edges 27', 28' and is cut diagonally along a line A—A to form a solder tail 26' and to separate each terminal 21' from the carrier strip 33' as indicated in FIG. 10, thus providing a beveled or angled end indicated at "E" in FIG. 11. The beveled end is cut at an acute angle and provides a reference point for optical measurements in order to determine whether the terminals 21' are properly spaced relative to the housing at correct regular intervals P. However, the beveled end E of the terminal 21' permits only a relatively small tolerance "d" for misalignment (shown at the left of the terminals) when inserting the terminals 21' into the engagement holes H' of a circuit board B' as illustrated in FIG. 12. Accordingly, the difficulty with which the terminals 21' may be inserted into the circuit board B' increases.

Figure 13:
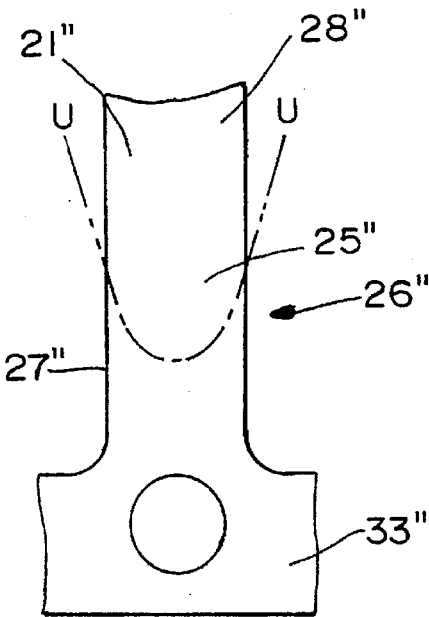
FIG. 13 is a plan view of a portion of still another conventional terminal wherein the portion is part of a carrier strip.

In order to facilitate optical measurement of the intervals P of the terminals 21 for quality control and to facilitate the insertion of terminals 21 into a circuit board, there has been proposed a third terminal 21" with a solder tail 26" having a rounded terminal end as shown in FIG. 13. It has an extended body portion 25" which is integrally formed with an elongated, transversely extending carrier strip 33". The body portion 25" has parallel edges 27", 28" which extend for the length of the body portion 25". The solder tail portion 26" is formed into a rounded shape along line U—U in FIG. 13 when it is separated from the carrier strip 33" by a cutting punch.

Figure 14:
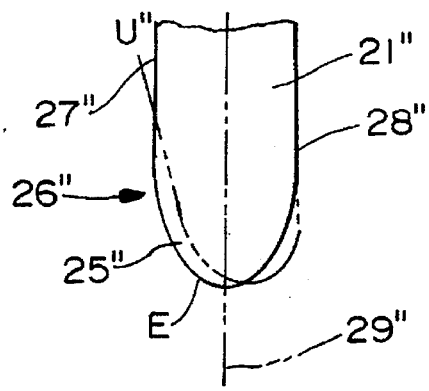
FIG. 14 is a plan view of the tail end of the terminal of FIG. 13 after cutting along line U—U of FIG. 13.
Figure 15:
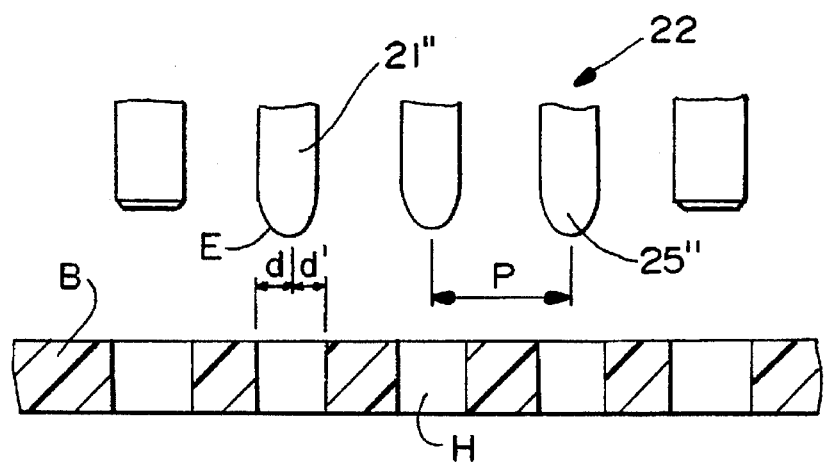
FIG. 15 shows the manner in which a connector using the terminals of FIG. 14 is mounted to a printed circuit board.

This rounded end is symmetrical around a centerline 29 and it provides a reference point for optical measurement to determine the spacing of the solder tails with respect to the circuit board engagement holes. It also provides a relatively large alignment tolerance "d" or "d'" on either side of the solder tail centerline as indicated in FIG. 15. However, the rounded cut illustrated in FIGS. 14 & 15 is more expensive and difficult than a straight or diagonal cut as illustrated in FIGS. 4, 5, 10 & 11.

Furthermore, incorrect severing, such as that which may occur if the cutting punch is even slightly misaligned with the terminals may lead to an appreciable deviation U' relative to the centerline 29 (FIG. 14) resulting in the terminals being arranged out of order with their reference points for optical measurement. This makes the quality control extremely difficult.

Figure 1:
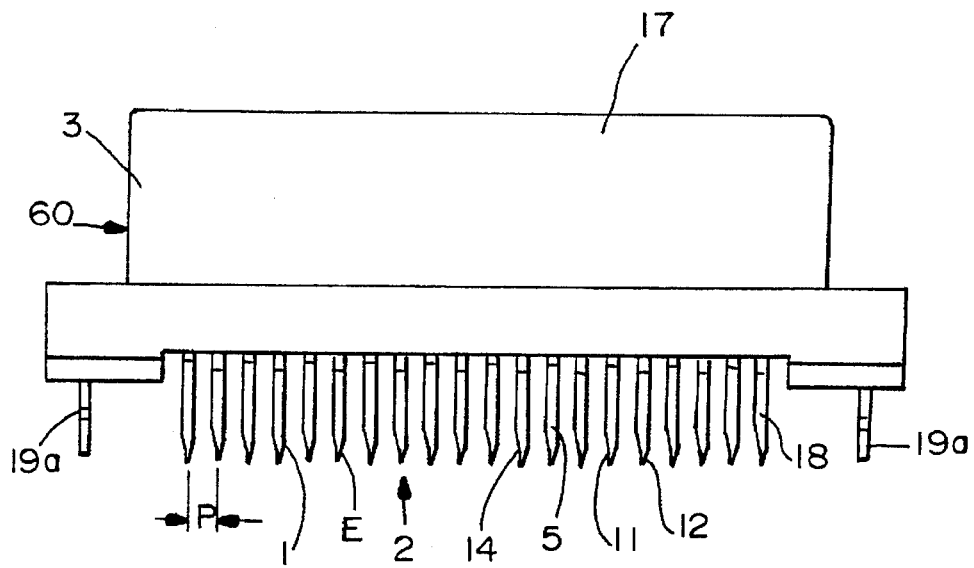
FIG. 1 is an elevational view of a connector utilizing a terminal assembly constructed in accordance with the principles of the present invention.
Figure 2:
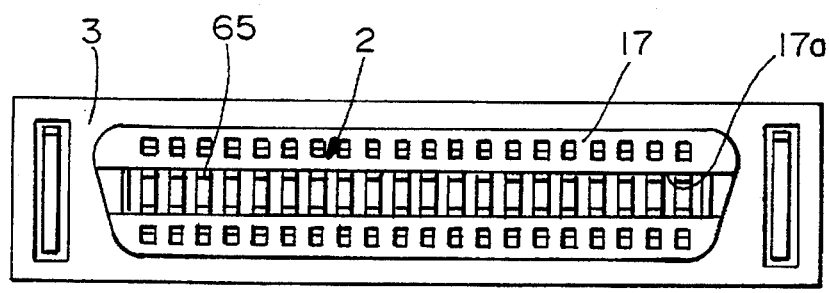
FIG. 2 is a plan of the connector of FIG. 1.
Figure 3:
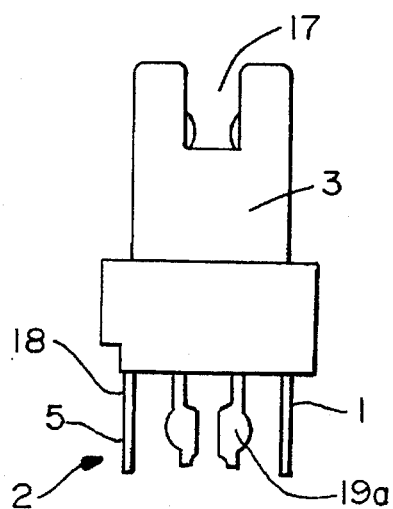
FIG. 3 is an elevational view of an end of the connector of FIG. 1.

Referring now to FIGS. 1–3, an electrical connector utilizing terminals constructed in accordance with the principles of the present invention is illustrated generally at 60 and comprises an elongated connector housing 3 having a group 2 of terminals 1 fixed to the housing 3 and extending therefrom at a lateral spacing "P" between centerlines of adjoining terminals 1. The top portion 17 of the connector housing 3 has an longitudinal channel or insertion slot 17a which is intended to accommodate an additional electric connector part, plug or secondary circuit card. Contact portions 65 of the terminals extend into this channel 17a.

Figure 6:
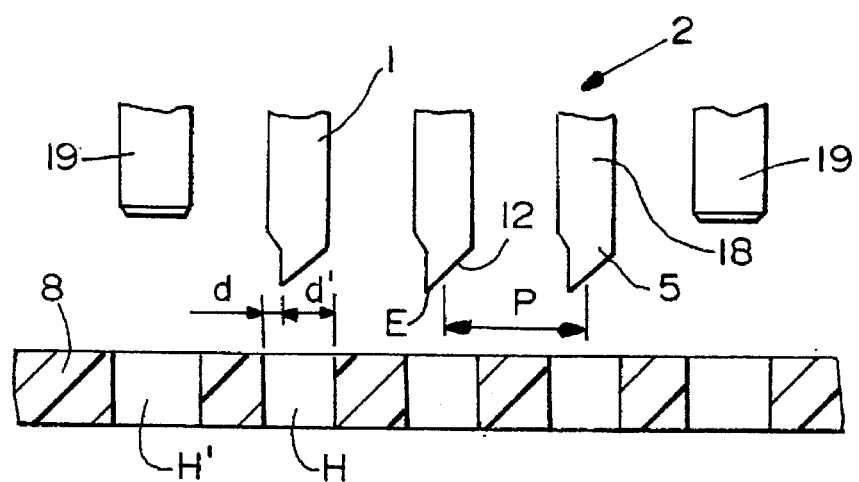
FIG. 6 shows the manner in which the connector of FIG. 1 is mounted to an associated printed circuit board.

The terminals include tail portions 18 which extend out of the connector through the bottom portion of the housing 3. These tail portions 18 serve as solder tails which are eventually soldered to an associated printed circuit board B. (FIG. 6.) The housing 3 may also include a pair of positioning pegs 19 and/or boardlocks 19a at its opposite ends to facilitate the positioning of the electric connector relative to the printed circuit board B.

Figure 4:
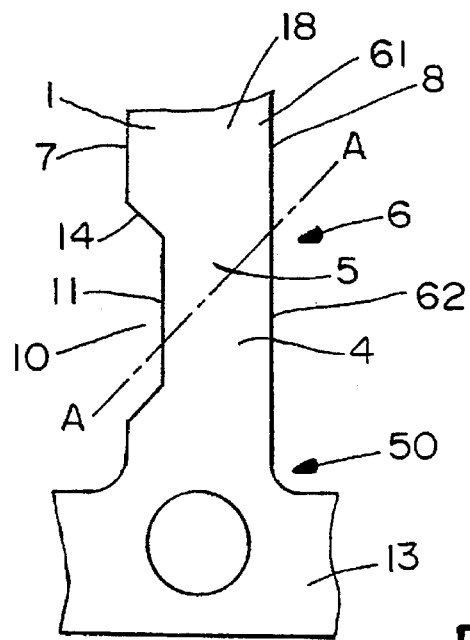
FIG. 4 is a plan view of a portion of a terminal assembly constructed in accordance with the principles of the present invention illustrating the portion wherein the terminal is formed as part of a carrier strip.
Figure 5:
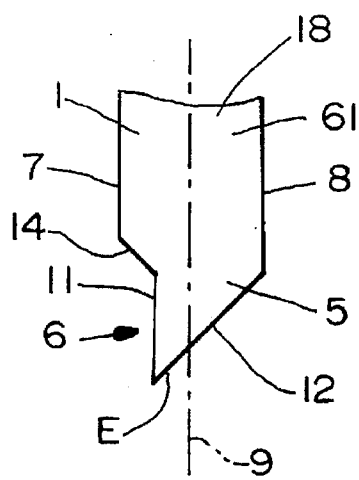
FIG. 5 is a plan view of the tail end of the terminal of FIG. 4 after cutting along line A—A of FIG. 4.

As seen in FIGS. 4 and 5, the terminals 1 are formed as part of an overall terminal assembly 50 which is initially stamped and formed from a strip of metal to provide a series of interconnected terminals integrally formed with a carrier strip 13 as is well known in the art. As illustrated in FIG. 4, the terminal 1 has a relatively wide body portion 61 which is integral with a reduced-width joint or neck portion 4, which in turn connects the terminal body portion 61 to the carrier strip 13. The terminal body portion 61 has two opposing, generally parallel edges 7, 8 which define a predetermined width of the body portion 61. The joint portion 4 is located adjacent the body portion 61 (shown below it in FIG. 4) and also has two longitudinal sides, or edges 11 and 62 which extend generally parallel to each other.

A plurality of such terminals 1 are integrally formed with the carrier strip 13, such as by stamping and forming the entire assembly from a single strip of metal. After being fixed to the connector housing 3, the terminals may be separated from the carrier strip 13 by cutting through the joint portions 4 at a diagonal (along line A—A of FIG. 4) to provide an acute angle at "E". This cutting forms a tapered end portion 6 of the soldering tail.

Focusing specifically on the reduced-width portion 5 of the terminal 1, it can be seen in FIGS. 5 & 6 that this portion has a first side, or edge 11, which is located inwardly of a corresponding edge 7 of the terminal body portion 61. This edge 11 is displaced or offset from the body portion first edge 7 toward the centerline 9 of the joint portion 4 and thereby substantially defines a notch, or reentrant portion 10, of the terminal 1. The reentrant portion 10 is formed on each terminal 1 during stamping of the elongated metal strip and has a configuration which is relatively easy to form upon a stamping die or cutting punch so that all of the terminals 1 integrally formed with the carrier 13 strip will have their reentrant sections 10 spaced apart from each other at regular intervals.

The opposing edge 62 of the reduced width portion 4 extends evenly from the opposite edge 8 of the terminal body portion 61 so that the reduction in width of the portion 4 is accomplished by the reentrant portion 10. However, it is contemplated that an additional reentrant portion may be provided in the opposing edge 62 if necessary. In forming the final solder tail, the reduced width portion 4 is cut along the diagonal line A—A illustrated which extends downwardly from the area where the terminal body portion 8 joins with the reduced width joint portion 4 to the reentrant portion 10. This cut is made at a diagonal and traverses the centerline 9 of the terminal 1. (FIG. 5.)

This diagonal cut defines a slanted edge or guide surface 12 which forms a tapered end E at the end of the terminal 1 and which serves as a "lead-in" portion for the terminal as explained below. Preferably, this tapered end of the terminal forms an acute angle. The lead-in portion 5 has a reduced width as compared to the terminal body portion 61 and presents the slanted edge or surface 12 in opposition to the circuit board engagement hole.

The terminal solder tails 18 are spaced apart at regular intervals from each other when all of the terminals 1 are diagonally cut and separated from the carrier strip 13. Once cut, all of the terminals 1 are consequently arranged with the intersecting straight and slanted sides 11, 12 of the tapered end 5 in a spaced-apart order wherein the same distances exist between straight and slant sides of adjacent terminals. This is advantageous when utilizing optical means for determining whether all of the terminals 1 are arranged at regular intervals as desired when automating the quality control of insertion of the terminal portions of the connectors into circuit boards.

As shown in FIG. 6, while attaching an electric connector to a circuit board B utilizing the terminals 1 of the present invention, the positioning pegs 19 of the connector 3 are inserted in the positioning holes H' of the circuit board B in a manner which permits the terminal tail portions 18 to enter the holes H of the printed circuit board B simultaneously. The tapered ends 5 of the terminals 1 extend through the board engagement holes and may project partially beyond the bottom surface of the board. Solder is applied to the solder tails and circuit board to affect a reliable electric attachment.

As described above, the reentrant portion may be easily formed in the terminals by stamping in a manner such that the reentrant portions of adjacent terminals are spaced apart from each other at regular intervals. The reentrant portion defines an interior edge 11 of the joint portion 4 which lies inwardly of the corresponding terminal body portion edge 7. The terminals 1 are defined into their final shape by cutting the joint portions 4 diagonally along line A—A to form a slanted, or angled edge 12 which extends inwardly across the terminal centerline 9 of the terminal to intersect with the first edge 11. Preferably, the angled edge 12 is formed at an acute angle to present the stepped, or sawtooth configuration of FIG. 5. The angled edged 12 of the tip of the solder tail extends generally opposite that of the angled edge or surface 14 of the reentrant portion 10 of the terminal so that if imaginary lines are extended along those two surfaces 12, 14, they will intersect. It will be appreciated that the two inclined edges 12, 14 cooperate to provides a dual alignment or positioning allowance d and d' (FIG. 6) on opposite sides of the tip of the solder tail 18. This allowance is located on both sides of the tail portion centerline and improves the mounting of connectors using such terminal assembly to circuit boards. Importantly, these two angled surfaces 12, 14 extend toward the centerline 9 of the tail portion at terminal 1 and of the circuit board engagement hole and thereby provide angled lead-in or pilot surfaces which may engage each edge of the holes during insertion, if necessary.

In the particular embodiment of FIG. 5, the tapered end 5 of the solder tail is described as having a straight edge 11 proximate to the centerline 9 rather than in alignment therewith. This off-center arrangement has the effect of increasing the resistance of terminal to deformation or other damage during handling and processing.

As may be understood from the above, an electric connector terminal assembly according to the present invention comprises a series of terminals each having a solder tail with a lead-in portion defined by an inward edge close to or in alignment with the imaginary centerline on one side and a slanted edge side diagonally traversing the centerline on the other side, thus forming an acute angle point in the vicinity of the centerline to provide comparable allowances on the opposite sides of the terminal centerline to assist in mounting the terminal assembly to a printed circuit board. The acute angle point is advantageous to the optical measurement of terminal intervals for quality control.

Accordingly, it will be appreciated that the embodiments of the present invention have discussed herein are merely illustrative of a few applications of the principles of the invention. Numerous modifications may be made by those skilled in the art without departing from the true spirit and scope of the invention.

We claim:

1. A terminal for use in an electrical connector of the type which is mounted upon a circuit board, the connector having a housing with a plurality of terminal receiving areas therein, said connector having a plurality of terminals in said terminal receiving areas, contact portions of the terminals being held within said housing while and tail portions of said terminals extend out of said housing, said tail portions being configured to be received in corresponding engagement holes of the circuit board, each said tail portion comprising:

a body portion that extends out from said connector housing when said terminal is received within said connector housing, and a lead-in portion disposed beneath the body portion and at a lower end of the body portion, said body portion having a first width and said lead-in portion having a second width which is less than said body portion first width, said lead-in portion being defined by at least two intersecting edges, a first of said edges being disposed at a reentrant portion generally adjacent the junction of said body portion and said lead-in portion, the first edge being disposed inwardly with respect to a corresponding first edge of said body portion and toward but spaced from a longitudinal centerline of said tail portion, the lead-in portion second edge crossing said centerline of said tail portion and intersecting said lead-in portion first edge at an acute angle to thereby define a tapered tip of said terminal, said reentrant portion and said first edge defining a width for the tapered tip that is greater than one-half and less than a full width of said body portion to provide substantial positioning allowance while also providing substantial resistance to deformation, the junction of said terminal body and lead-in portions including an angled edge which forms part of said reentrant portion and which is disposed opposite said lead-in portion second edge such that said lead-in portion second edge and said angled edge present two angles surfaces that extend toward the tail portion centerline.

2. The terminal as defined in claim 1, wherein said lead-in portion first edge is spaced apart from and generally parallel to said tail portion centerline.

3. The terminal as defined in claim 1, wherein said reentrant portion extends inwardly from said body portion toward said tail portion centerline.

4. The terminal as defined in claim 1, wherein said lead-in portion first edge is generally parallel to two opposing edges of said terminal body portion and is disposed inwardly of one of said body portion edges, thereby defining a misalignment tolerance.

5. The terminal as defined in claim 4, wherein said lead-in portion first edge is spaced apart from said tail portion centerline.

6. The terminal as defined in claim 1, wherein said angled edge is disposed at said reentrant portion such that an imaginary line drawn along said angled edge crosses said tail portion centerline.

7. The terminal as defined in claim 4, wherein said angled edge is disposed at reentrant portion such that an imaginary line drawn along said angled edge crosses said tail portion centerline.

8. The terminal as defined in claim 4, wherein said angled edge defines part of said reentrant portion and is disposed on said terminal such that an imaginary line drawn along said angled edge crosses said tail portion centerline and intersects with said lead-in portion second edge between said lead-in portion first edge and one of said body portion edges.

9. A connector adapted for mounting on a printed circuit board, the connector including a dielectric housing having a plurality of terminal receiving areas therein, the connector housing having a plurality of electrically conductive terminals disposed within said areas, each terminal having a contact portion for mating with an electrically conductive portion of another circuit element and a tail portion which extends out of said housing and which is dimensioned to be received in a hole of a predetermined width on the printed circuit board, each tail portion including an angled tip having a terminal tail portion misalignment tolerance associated therewith such that the angled tip has a width which is less than the width of the hole, each tail portion further including a body portion having opposing first and second edges, a reentrant portion associated therewith and intersecting with one of said body portion opposing edges, the reentrant portion including an angled edge extending toward a centerline of said terminal tail portion and a connecting edge intersecting said angled edge and disposed on said terminal tail portion inwardly of one of said body portion opposing edges the width of the angled tip being greater than one-half of the width of the tail portion to provide substantial positioning allowance while also providing substantial resistance to deformation, said reentrant portion connecting edge forming an edge of said terminal tail portion angled tip, said terminal tail portion misalignment tolerance being defined by the extent to which said reentrant portion extends inwardly of said body portion one edge.

10. The connector as defined in claim 9, wherein said reentrant portion angled edge is disposed on said terminal tail portion such that an imaginary line drawn therealong intersects said terminal tail portion centerline and an angled surface of said terminal tail portion angled tip.

11. The connector as defined in claim 9, wherein said terminal tail portion angled tip forms an acute angle.

12. The connector as defined in claim 9, wherein said reentrant portion connecting edge is substantially parallel to said body portion first edge.

13. The connector as defined in claim 9, wherein said terminal tail portion angled tip includes an angled surface extending in a direction opposite that of said reentrant portion angled surface.

14. A terminal for an electrical connector, comprising a contact portion which is received within a housing of the connector, a tail portion which extends from the connector and is adapted to be received within a hole of a circuit member, said tail portion having a body portion defined in part by two opposing generally parallel surfaces, said tail portion also having a lead-in portion of reduced width disposed generally adjacent the body portion, the lead-in portion being defined by: an inclined first pilot surface which intersects both a longitudinal centerline of said tail portion and one of said body portion two opposing surfaces;

an inclined second pilot surface which intersects the other of said body portion two opposing surfaces; and a connecting surface disposed inwardly of said body portion opposing surfaces and extending between said first and second pilot surfaces, said first and second pilot surfaces being oppositely inclined and positioned to provide misalignment tolerance on opposite sides of the terminal as the terminal enters a hole of the circuit member.

15. The terminal as defined in claim 14, wherein said connecting surface is substantially linear.

16. The terminal as defined in claim 14, wherein said first and second pilot surfaces have different lengths.

17. The terminal as defined in claim 14, wherein said second pilot surface and said connecting surface cooperate to define a reentrant portion of said terminal which is offset from said body portion other opposing surface.

18. A connector adapted for mounting on a printed circuit board, the connector including a dielectric housing having a plurality of terminal receiving areas therein, the connector housing having a plurality of electrically conductive terminals disposed within said areas, each terminal comprising:

a body portion having substantially parallel side edges defining halfway therebetween a terminal centerline, said edges also defining a body portion width as the distance from one to the other of said substantially parallel side edges; and an asymmetrical lead-in portion disposed adjacent said body portion, said lead-in portion comprising a triangular tip portion and a trapezoidal transitional portion, said transitional portion being disposed between said tip portion and said body portion;

said tip portion comprising a slanted edge and a connecting edge, said slanted edge extending from one of said body portion parallel side edges across said terminal centerline to said connecting edge and forming an acute angle with said connecting edge;

said transitional portion comprising an angled edge extending from the other of said body portion parallel side edges to a line generally parallel to said tip portion connecting edge such that the intersection of said angled edge and said line generally parallel to said connecting edge is more proximate to the said terminal centerline than is the intersection of said angled edge and said parallel edge.

19. A connector in accordance with claim 18 wherein said connecting edge is generally parallel to, but offset from, said terminal centerline.

20. A connector in accordance with claim 19 wherein said housing is generally elongated and said terminals are positioned in a row generally parallel to a longitudinal axis of said housing, each of said substantially parallel side edges opposing a side edge of an adjacent terminal in said row.

* * * * *